(12) United States Patent
Zeidler et al.

(10) Patent No.: US 10,741,355 B1
(45) Date of Patent: Aug. 11, 2020

(54) MULTI-BEAM CHARGED PARTICLE SYSTEM

(71) Applicant: Carl Zeiss Microscopy GmbH, Jena (DE)

(72) Inventors: Dirk Zeidler, Oberkochen (DE); Thomas Kemen, Meppen (DE); Christof Riedesel, Aalen (DE); Ralf Lenke, Lauchheim (DE); Joerg Jacobi, Herbrechtingen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 0 days.

(21) Appl. No.: 16/266,842

(22) Filed: Feb. 4, 2019

(51) Int. Cl.
*H01J 37/10* (2006.01)
*H01J 37/09* (2006.01)
*H01J 37/28* (2006.01)

(52) U.S. Cl.
CPC .............. *H01J 37/10* (2013.01); *H01J 37/09* (2013.01); *H01J 37/28* (2013.01); *H01J 2237/0453* (2013.01); *H01J 2237/1202* (2013.01)

(58) Field of Classification Search
CPC .. H01J 37/10; H01J 37/09; H01J 37/28; H01J 2237/0453; H01J 2237/1202
USPC ............. 250/306, 307, 309, 310, 311, 492.1, 250/492.2, 492.3, 396 R
See application file for complete search history.

(56) References Cited

U.S. PATENT DOCUMENTS

| | | |
|---|---|---|
| 2006/0289804 A1 | 12/2006 | Knippelmeyer et al. |
| 2009/0114818 A1 | 5/2009 | Casares et al. |
| 2009/0159810 A1 | 6/2009 | Knippelmeyer et al. |
| 2009/0256075 A1 | 10/2009 | Kemen et al. |
| 2015/0069235 A1 | 3/2015 | Kemen et al. |
| 2015/0083911 A1 | 3/2015 | Zeidler et al. |
| 2015/0348738 A1* | 12/2015 | Zeidler .................. H01J 37/10 250/396 R |
| 2015/0357157 A1 | 12/2015 | Mueller et al. |
| 2017/0133194 A1* | 5/2017 | Zeidler .................. H01J 37/10 |
| 2017/0316912 A1 | 11/2017 | Zeidler et al. |
| 2018/0158645 A1* | 6/2018 | Cho ........................ H01J 37/20 |

* cited by examiner

*Primary Examiner* — Nicole M Ippolito
(74) *Attorney, Agent, or Firm* — Fish & Richardson P.C.

(57) ABSTRACT

A multi-beam charged particle system includes: a vacuum enclosure having an opening covered by a door; a particle source configured to generate charged particles, wherein the particle source is arranged within the vacuum enclosure; at least one multi-aperture plate module including at least one multi-aperture plate and a base; and a transfer box having an opening covered by a door. The at least one multi-aperture plate includes a plurality of apertures. The base is configured to hold the at least one multi-aperture plate. The base is configured to be fixed relative to the vacuum enclosure such that the multi-aperture plate module is arranged in an interior of the vacuum enclosure such that, during operation of the particle beam system, particles traverse the plural multi-aperture plates through the apertures of the plates.

20 Claims, 3 Drawing Sheets

MULTI-BEAM CHARGED PARTICLE SYSTEM

FIELD

The disclosure relates to multi-beam charged particle systems using plural beams of charged particles.

BACKGROUND

US 2017/0133194 A1 discloses a multi-beam charged particle system which uses plural electron beams in parallel for scanning an object to be inspected. The plural electron beams are generated by directing an electron beam generated by an electron source onto a multi-aperture plate having a plurality of apertures. One portion of the electrons are absorbed by the multi-aperture plate, and another portion of the electrons traverse apertures of the multi-aperture plate so that a plurality of electron beams is formed downstream of this multi-aperture plate. Moreover, one or more additional multi-aperture plates are arranged in the beam path of the electron beams downstream of the first multi-aperture plate such that each of the electron beams traverses an aperture of the additional multi-aperture plates. The additional multi-aperture plates provide electric or magnetic fields within or adjacent to their apertures in order to manipulate the electron beams traversing the apertures. For example, the electric or magnetic fields can change the convergence or the astigmatism of the beam or they can deflect the electron beam traversing an aperture.

Diameters of the apertures of the multi-aperture plates can be in the order of ten micrometers or less, and a multi-aperture plate may have more than 100 apertures. It can be challenging to produce and to handle multi-aperture plate modules including stacks of plural multi-aperture plates. A deficiency of one aperture of one multi-aperture plate of the multi-aperture plate module may result in one deficient beam such that the performance of the electron microscope is severely affected or in that the multi-aperture plate module cannot be used at all.

SUMMARY

The disclosure seeks to provide a multi-beam charged particle system allowing to improve the handling of multi-aperture plate modules and to extend the lifetime of multi-aperture plate modules.

Embodiments of the disclosure provide multi-beam charged particle systems allowing to handle and maintain multi-aperture plate modules with higher reliability. The multi-beam charged particle systems according to these embodiments allow to prevent the degradation of the multi-aperture plate modules in a process of mounting the multi-aperture plate module in the multi-beam charged particle system, during use of the multi-aperture plate module in the multi-beam charged particle system, and during storage of the multi-aperture plate module outside of the multi-beam charged particle system for later use or re-use. Specifically, embodiments of the disclosure may prevent contamination of the multi-aperture plates with particles, dust and molecules which can be present in an environment of the multi-beam charged particle system.

According to embodiments, a multi-aperture plate module includes plural multi-aperture plates and a base, wherein each of the multi-aperture plates includes a plurality of apertures and wherein the base is configured to hold the plural multi-aperture plates such that they are spaced apart from each other.

According to some embodiments, a multi-beam charged particle system includes a vacuum enclosure having an opening covered by a door, a particle source configured to generate charged particles, wherein the particle source is arranged within the vacuum enclosure. The multi-beam charged particle system further includes at least one multi-aperture plate module including at least one multi-aperture plate mounted on a base, wherein the base is configured to be fixed relative to the vacuum enclosure such that the at least one multi-aperture plate is arranged in an interior of the vacuum enclosure such that, during operation of the particle beam system, particles traverse apertures of the at least one multi-aperture plate. The multi-beam charged particle system further includes a transfer box having an opening closed by a door, wherein the transfer box is configured to be coupled to the vacuum enclosure such that, when the door of the transfer box is in its open state, the at least one multi-aperture plate can be moved from the interior of the vacuum enclosure to an interior of the transfer box by traversing the opening of the vacuum enclosure and the opening of the transfer box. Moreover, it may be possible to move the at least one multi-aperture plate from the interior of the transfer box to the interior of the vacuum enclosure by traversing the opening of the transfer box and the opening of the vacuum enclosure.

The transfer box can be used as a housing for the at least one multi-aperture plate when it is not mounted within the vacuum enclosure. For example, the transfer box can be used to transport the at least one multi-aperture plate from its manufacturing place to the vacuum enclosure. Moreover, a multi-aperture plate module mounted within the vacuum enclosure and used for manipulating particle beams can be moved into the transfer box and stored in the transfer box for later use when it is no longer required for manipulating the particle beams or when it is to be replaced by some other multi-aperture plate module. The transfer box can be purged with a suitable gas, such as Nitrogen, to remove contaminating particles and humidity and to keep the at least one multi-aperture plate in a controlled environment during storage.

According to particular embodiments, a base holding one or more multi-aperture plates is mounted on the door of the vacuum enclosure. According to further embodiments herein, the transfer box is configured to receive the door of the vacuum enclosure in its interior. The base can be fixed to the door of the vacuum enclosure, and the door of the vacuum enclosure can be stored in the interior of the transfer box together with the at least one multi-aperture plate held by the base. When plural multi-aperture plate modules are used with the multi-beam charged particle system, plural doors of the vacuum enclosure are provided, wherein each multi-aperture plate module is mounted to its own door.

According to some embodiments, a multi-beam charged particle system includes a vacuum enclosure having at least a first vacuum space, a second vacuum space and a third vacuum space, wherein the first vacuum space communicates with the second vacuum space via a first tube and wherein the second vacuum space communicates with the third vacuum space via a second tube. A particle source is arranged in the first vacuum space and configured to generate charged particles such that the charged particles enter the second vacuum space by traversing the first tube. At least one multi-aperture plate is arranged in the second vacuum space such that charged particles entering the second vacuum space by traversing the first tube traverse apertures of the at least one multi-aperture plate. Particle beams traversing apertures of the at least one multi-aperture plate enter the third vacuum space by traversing the second tube. An object stage is mounted in the third vacuum space such that the particle beams entering the third vacuum space by traversing the second tube can be incident on an object mounted on the object stage. The multi-beam charged particle system may include one or more additional vacuum spaces which can be arranged in between the first and second vacuum spaces or the second and third vacuum spaces, wherein the one or more additional vacuum spaces which are traversed by the charged particles and which communicate with adjacent other vacuum spaces. Tubes of the type illustrated above can be provided between the one or more additional vacuum spaces and their adjacent vacuum spaces. However, such additional tubes are not required.

According to particular embodiments herein, at least one of the first and second tubes includes a tube section having a length L in millimeters, wherein a cross-section of the tube is less than an area F in square millimeters at each position along the tube section, and wherein F divided by L is less than 10.

According to exemplary embodiments, the first tube and/or second tube has a direction of extension oriented substantially in a same direction as trajectories of the particles traversing the tube. For example, an angle between the direction of extension of the tube and directions of trajectories of the particles traversing the tube can be smaller than 20°, smaller than 10°, or smaller than 5°.

The separation of the vacuum spaces by tubes of such geometry does not prevent or restrict the propagation of the charged particles from the first vacuum space to the second vacuum space and from the second vacuum space to the third vacuum space. However, these tubes prevent gas and impurities from traveling between the vacuum spaces. Specifically, gas and impurities can be introduced into the third vacuum space when an object is mounted on the object stage. Diffusion of contaminating particles and molecules from the third vacuum space to the second vacuum space is significantly reduced by the presence of the second tube providing the communication between the third and second vacuum spaces. The second tube provides a passage which can be traversed by the directed charged particle beams without significant loss but which significantly prevents a flow and a diffusion of contaminating particles and molecules from the third vacuum space to the second vacuum space.

It is possible that there are provided additional communication passages between the first and second vacuum spaces and the second and third vacuum spaces. For example, each of the first, second and third vacuum spaces can be directly or indirectly connected to a vacuum pump system so that there exist additional gas passages between the first, second and third vacuum spaces. These additional gas passages basically allow the movement of particles from one vacuum space to the other. However, such additional communication passages have a significantly higher resistance to gas flow between the respective vacuum spaces than the first and second tubes, such that the gas flow between the first, second and third vacuum spaces via the additional communication passages is significantly reduced as compared to the gas flow through the first and second pipes, respectively.

According to further embodiments, the area F in square millimeters divided by the length L in millimeters can be less than 5 or less than 2, the area F in square millimeters can be less than 60, less than 40, less than 30 or less than 20, and the length L in millimeters can be greater than 10, greater than 20 or greater than 40.

According to some embodiments, a wall of the first and second tubes is a substantially closed wall. This means that the wall has no perforations or that the wall may have perforations providing only small passages for gas molecules from an interior of the respective tube to an exterior thereof. Such small perforations may have cross-sections of less than 25 mm$^2$, 12 mm$^2$, 5 mm$^2$ or 1 mm$^2$.

According to some embodiments, the multi-beam charged particle system includes a condenser lens, wherein the first tube extends through the condenser lens.

According to further embodiments, the multi-beam charged particle system includes an objective lens, wherein the second tube extends through at least a portion of the objective lens.

According to some embodiments, a multi-beam charged particle system is configured such that, during operation of the multi-beam charged particle system, a vacuum pressure within a vacuum space containing a multi-aperture plate is below $1 \cdot 10^{-7}$ mbar.

According to further embodiments, a multi-beam charged particle system includes a vacuum enclosure having at least a first vacuum space, a second vacuum space and a third vacuum space, wherein the first vacuum space communicates with the second vacuum space, and wherein the second vacuum space communicates with the third vacuum space; a particle source arranged in the first vacuum space and configured to generate charged particles such that the charged particles enter the second vacuum space; at least one multi-aperture plate module including at least one multi-aperture plate, wherein the multi-aperture plate module is arranged in the second vacuum space such that charged particles entering the second vacuum space traverse apertures of the at least one multi-aperture plate and form a plurality of particle beams downstream of the multi-aperture plate module, wherein the particle beams enter the third vacuum space; and an object stage mounted in the third vacuum space such that the particle beams entering the third vacuum space are incident on an object mounted on the object stage; wherein, during operation of the multi-beam charged particle system, a vacuum pressure within the second vacuum space can be below $1 \cdot 10^{-7}$ mbar.

BRIEF DESCRIPTION OF THE DRAWINGS

Embodiments of the present disclosure will be explained in more detail with reference to the drawings, in which.

DESCRIPTION OF EXEMPLARY EMBODIMENTS

Figure 1:
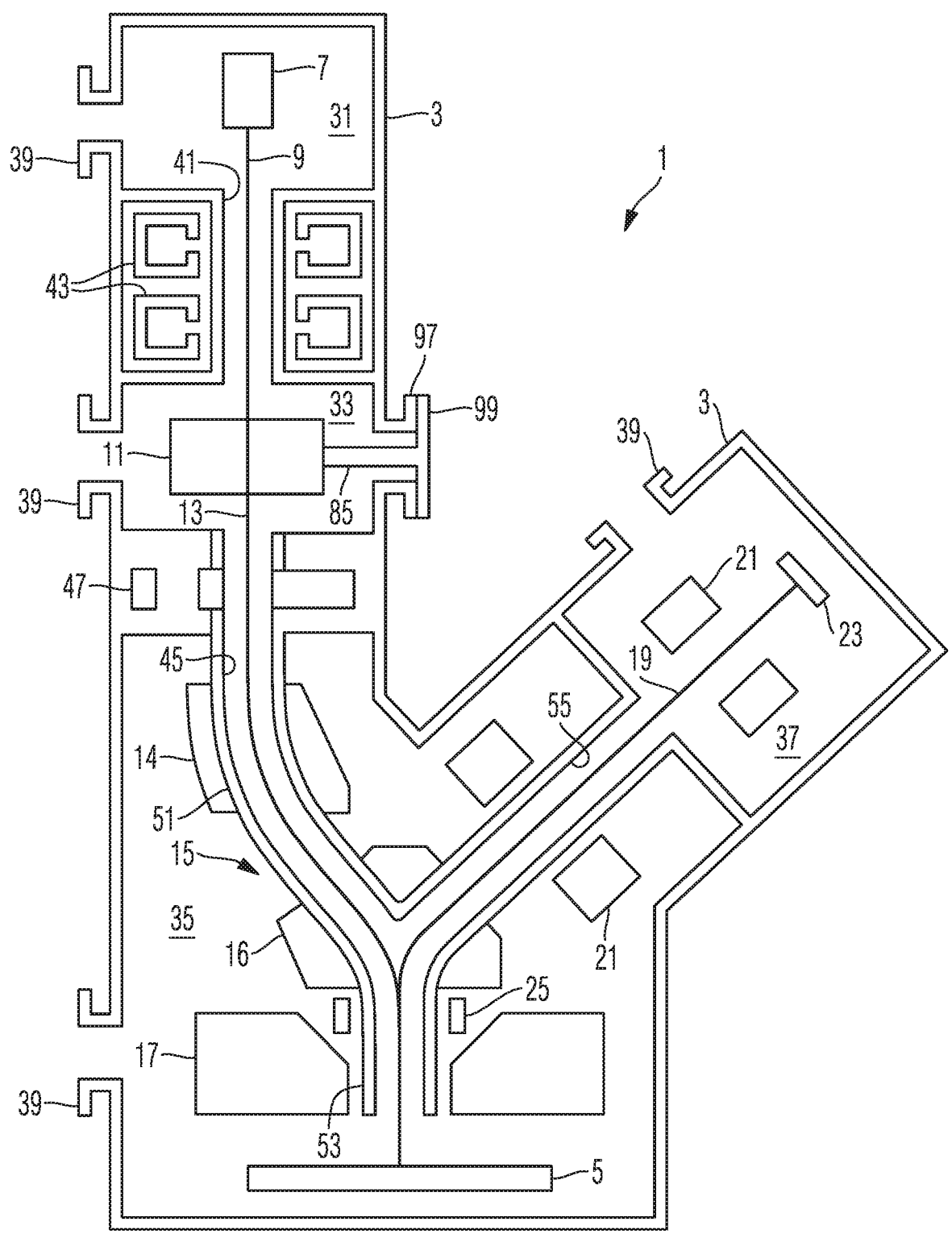
FIG. 1 is a schematic sectional view of a multi-beam charged particle system according to an embodiment.

FIG. 1 is a schematic cross-sectional view of a multi-beam charged particle system 1. The multi-beam charged particle system 1 includes a vacuum enclosure 3 housing components for providing a beam path for charged particles such that the multi-beam charged particle system 1 can perform its function. In the present example, the multi-beam charged particle system 1 is a multi-beam electron microscope, and the components housed by the vacuum enclosure 3 provide the beam path for a plurality of electron beams and the components are configured such that the electron beams are manipulated such that the multi-beam charged particle system 1 can be used to record electron microscopic images of an object mounted on an object stage 5 arranged within the vacuum enclosure 3.

For this purpose, the multi-beam charged particle system 1 includes a particle source 7 configured to generate charged particles. The charged particles emitted from the particle source 7 travel along a beam path 9 and traverse a multi-aperture plate module 11. The multi-aperture plate module 11 includes at least one multi-aperture plate, wherein the multi-aperture plate includes a plurality of apertures. Charged particles emitted from the particle source 7 traverse at least some of the apertures of the at least one multi-aperture plate of the multi-aperture plate module 11. A plurality of particle beams will travel downwards in FIG. 1 along a beam path 13, accordingly.

The particle beams traverse a beam splitter 15 and an objective lens 17 to be incident on the object mounted on the object mount 5. The objective lens 17 focuses the individual beams such that they illuminate an array of small beam spots on the surface of the object. The particles incident on the object generate electrons which are emitted from the object and collected and accelerated by the objective lens 17 such that an array of electron beams is formed. These electron beams traverse the beam splitter 15 along a beam path 19. Plural electron lenses 21 manipulate the bundle of electron beams such that they image the surface of the object mounted on the object mount 5 onto an electron detector 23. Beam deflectors 25 are arranged within or near the objective lens 17. The beam deflectors 25 are controlled for deflecting the particle beams incident on the object such that the array of beam spots is scanned across the surface of the object. An electron microscopic image of the object can be generated by associating signals detected by the electron detector 23 with scan positions of the beam spots formed on the surface of the object.

The vacuum enclosure 3 is configured such that a vacuum can be maintained in its interior. Moreover, the interior of the vacuum enclosure 3 is divided into plural vacuum spaces. A first vacuum space 31 houses the particle source 7, a second vacuum space 33 houses the multi-aperture plate module 11, a third vacuum space 35 houses the object stage 5, and a fourth vacuum space 37 houses the electron detector 23. The vacuum enclosure 3 includes plural connecting ports 39 which can be connected to a pump system (not shown in the drawing) so that each of the vacuum spaces 31, 33, 35, 37 can be evacuated.

The first vacuum space 31 communicates with the second vacuum space 33 via a tube 41. The beam path 9 extends through the tube 41 so that the particles generated by the particle source 7 may enter the second vacuum space 33 by traversing the first tube 41. The first tube 41 has a section of a length L in millimeters of 91, wherein a cross-section F in square millimeters of the first tube 41 is about 95 at each position along the section of length L. F/L has a value of about 1.0, accordingly.

The multi-beam charged particle system 1 includes two condenser lenses 43 for collimating the particles emitted by the particle source 7. The condenser lenses 43 generate focusing magnetic fields within the tube 41.

The second vacuum space 33 communicates with the third vacuum space 35 via a second tube 45. A vacuum shutter 47 is provided between the second vacuum space 33 and the third vacuum space 35. The vacuum shutter 47 can be operated to selectively open and close the communication between the second vacuum space 33 and the third vacuum space 35. When the vacuum shutter 47 is closed, it is possible to break the vacuum in the third vacuum space 35 without breaking the vacuum in the first and second vacuum spaces 31, 33, when, for example, samples have to be transferred out of and into the third vacuum space 35. Additional shutters can be provided between other pairs of vacuum spaces. For example, when a shutter between the first and second vacuum space is included in addition to the shutter 47 between the second and third vacuum space, it is possible to transfer the multi-aperture plate module out of and into the second vacuum space without breaking the vacuum in the first and third vacuum spaces.

The second tube 45 may have plural sections of different diameters. One section 51 is a curved section traversing the magnets 14 and 16 of the beam splitter. Another section 53 traverses the objective lens 17. The section 51 has a length L in millimeters, measured along the beam path 9, of about 217. A cross-section F in square millimeters of the tube 45 within its section 51 is about 180 at each position within this section 51. F/L has a value of about 1.0, accordingly. The section 53 of the second tube 45 has a length L in millimeters of 55 and a cross-section F in square millimeters of 227. F/L has a value of about 3.2 for the section 53, accordingly. The third vacuum space 35 communicates with the second vacuum space 33 via the tube 45 having the sections 51 and 53. Each of the sections 51 and 53 and the serial connection of the sections 51 and 53 fulfills the relations that F/L is less than 10, less than 5 or less than 2.

The third vacuum space 35 communicates with the fourth vacuum 37 via the section 53 of the second tube 45 and a fourth tube 55. The fourth tube 55 has a length L in millimeters of 148 and a cross-section F in square millimeters of less than about 227 along its length such that F/L has a value of less than about 1.5. The fourth tube can be integrally formed with the second tube 45.

Figure 2:
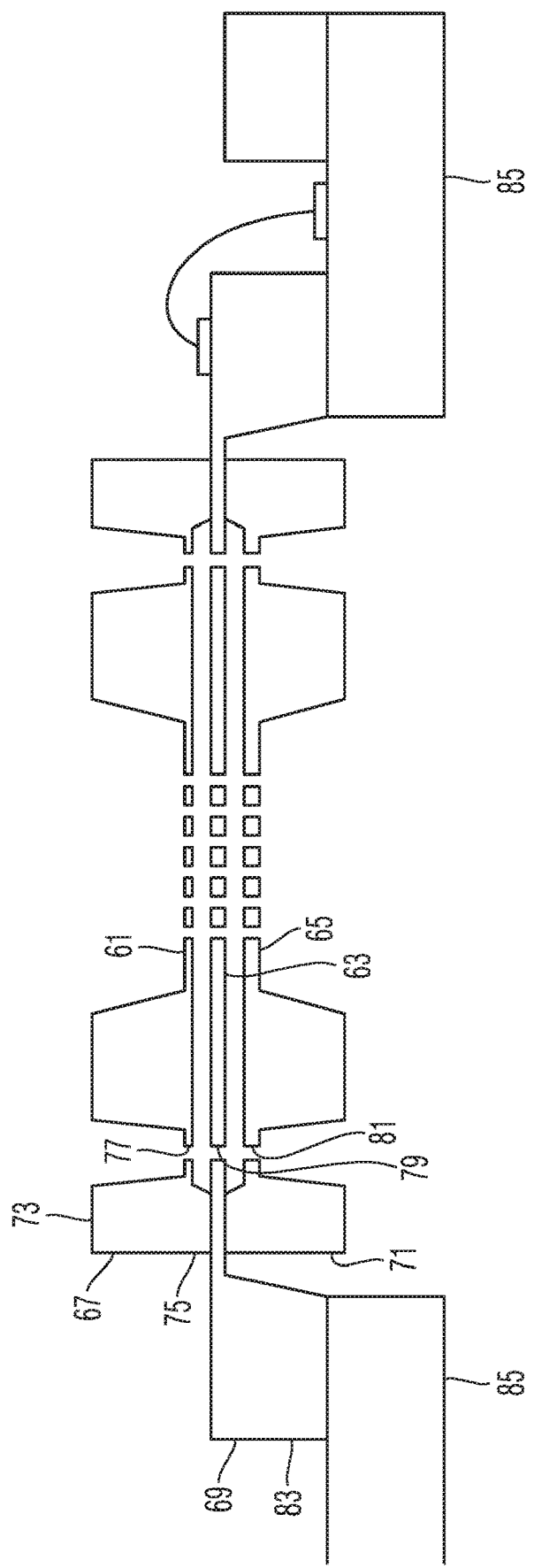
FIG. 2 is a schematic sectional view of a multi-aperture plate module used in the multi-beam charged particle system of FIG. 1.

FIG. 2 is a more detailed schematic sectional view of the multi-aperture plate module 11. The multi-aperture plate module 11 includes a plurality of multi-aperture plates 61, 63 and 65. In the present example, a number of the multi-aperture plates amounts to three.

A first multi-aperture plate 61 is a thinner diaphragm region of a thicker first plate 67, the second multi-aperture plate 63 is a thinner diaphragm region of a thicker second plate 69, and the third multi-aperture plate 65 is a thinner diaphragm region of a thicker third plate 71. The first plate 67 for the first multi-aperture plate 61 has a thick frame region 73 with a projection 75 with which the first plate 67 is supported at the diaphragm region of the second plate 69 and fastened. The fastening between the plates 67 and 69 can be realized, for example, by bonding. In order to control the relevant bonding process, there are provided in the frame region 73 a plurality of openings 77 which, given correct positioning of the openings of the first multi-aperture plate 61 and of the second multi-aperture plate 63, are flush relative to one another with openings 79 which are provided in the second plate 69. The alignment of the openings 77 and 79 relative to one another can be checked under a microscope during the bonding operation. Manipulators can be used to move the plates relative to one another before curing of the bonding agent used, and to position them correctly. In a similar way, the frame region of the third plate 71 for the third multi-aperture plate 65 is supported at the second plate 69 and likewise has openings 81 which are flush with the openings 79 in the second plate 69, in order also to fasten the third plate 71 at the second plate 69 by bonding. A frame region 83 of the second plate 69 is supported on a base 85 which serves as holder for the arrangement of the plural multi-aperture plates 61, 63 and 65.

More detailed information relating to the manufacture and use of multi-aperture plate modules can be obtained from US 2017/0133194 A1, the full disclosure of which is incorporated herein by reference.

Figure 3:
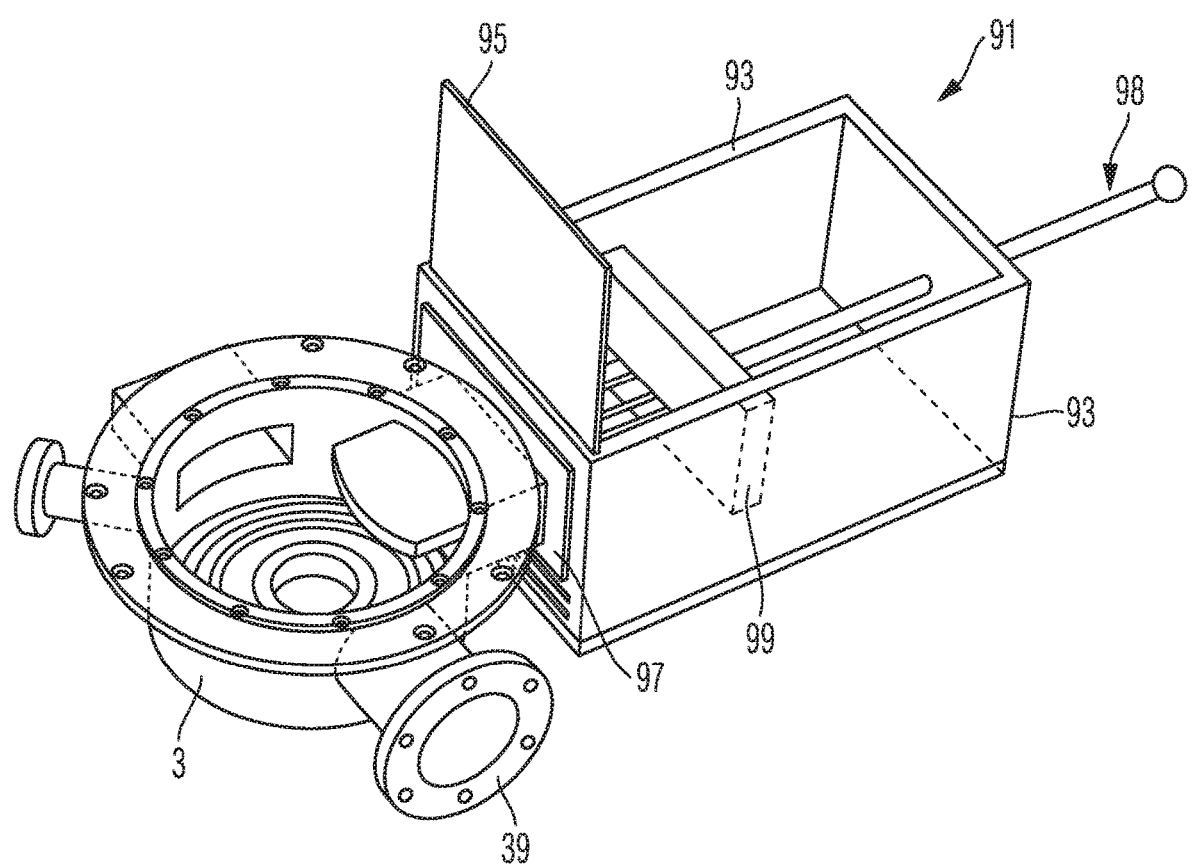
FIG. 3 is a perspective view illustrating a transfer box of the multi-beam charged particle system of FIG. 1.

FIG. 3 is a perspective view illustrating a transfer box 91 which can be used to transport and store a multi-aperture plate module and which can be attached to the vacuum enclosure 33 in order to move a multi-aperture plate module from the interior of the vacuum enclosure 33 to the interior of the transfer box 91 and to move a multi-aperture plate module from the interior of the transfer box 91 to the interior of the vacuum enclosure 33.

The transfer box 91 has five sidewalls 93 and a front door 95 defining the interior of the transfer box 91 when the front door 95 is closed. The transfer box 91 can be attached to a flange 97 of the vacuum enclosure. Thereafter, the front door 95 of the transfer box 91 can be opened, and a vacuum door 99 of the vacuum enclosure 3 can be released from the vacuum enclosure 3 and pulled into the interior of the transfer box 91. Since the base 85 of the multi-aperture plate module 11 is fixed to the inner wall of the door 99 of the vacuum enclosure 3, the multi-aperture plate module 11 is pulled into the interior of the transfer box 91 together with the vacuum door 99. Thereafter, the front door 95 can be closed, and the multi-aperture plate module 11 is securely stored within the transfer box 91. A rod 98 can be provided on the transfer box 91, wherein one end of the rod can be attached to the vacuum door 99 such that the movement of the vacuum door 99 and multi-aperture plate module 11, respectively, can be achieved by manipulating the other end of the rod 98 extending to the outside of the transfer box 91.

The above process can be reversed, and the transfer box 91 already containing a multi-aperture plate module can be attached to the flange 97 of the vacuum enclosure 3, the front door 95 of the transfer box 91 can be opened, and the multi-aperture plate module 11 can be moved into the interior of the vacuum enclosure 3 until the door 99 abuts against the flange 97. Thereafter, the transfer box is removed from the vacuum enclosure 3, the door 99 is fixed to the vacuum enclosure 3, and the multi-aperture plate module 11 is securely held in the interior of the vacuum space 33 which can then be evacuated.

What is claimed is:

1. A multi-beam charged particle system, comprising:
a vacuum enclosure having an opening covered by a door;
a particle source configured to generate charged particles, the particle source being within the vacuum enclosure;
a multi-aperture plate module comprising a multi-aperture plate and a base, wherein the multi-aperture plate comprises a plurality of apertures, the base being configured to hold the multi-aperture plate, the base being configured to be fixed relative to the vacuum enclosure so that the multi-aperture plate module is arranged in an interior of the vacuum enclosure so that, during operation of the particle beam system, particles traverse the multi-aperture module through the plurality of apertures of the multi-aperture plate; and
a transfer box having an opening covered by a door, wherein the transfer box is configured to be coupled to the vacuum enclosure so that, when the door of the transfer box is in its opened state, the multi-aperture plate module is moveable from the interior of the vacuum enclosure to an interior of the transfer box by traversing the opening of the vacuum enclosure and the opening of the transfer box.

2. The multi-beam charged particle system of claim 1, wherein the base is mounted on the door of the vacuum enclosure.

3. The multi-beam charged particle system of claim 2, wherein the transfer box is configured to receive the door of the vacuum enclosure in its interior.

4. The multi-beam charged particle system of claim 1, wherein the transfer box is configured to receive the door of the vacuum enclosure in its interior.

5. A multi-beam charged particle system, comprising:
a vacuum enclosure comprising first, second and third vacuum space, the first vacuum space being in communication with the second vacuum space via a first tube, and the second vacuum space being in communication with the third vacuum space via a second tube;
a particle source arranged in the first vacuum space and configured to generate charged particles so that the charged particles enter the second vacuum space by traversing the first tube;
a multi-aperture plate module comprising a multi-aperture plate, the multi-aperture plate module being arranged in the second vacuum space so that: charged particles enter the second vacuum space by traversing the first tube traverse apertures of the multi-aperture plate to form a plurality of particle beams downstream of the multi-aperture plate module; and the particle beams enter the third vacuum space by traversing the second tube; and
an object stage mounted in the third vacuum space so that the particle beams entering the third vacuum space by traversing the second tube are incident on an object mounted on the object stage;
wherein, for each of the first and second tubes:
the tube comprises a tube section having a length L in millimeters;
a cross-section of the tube is less than an area F in square millimeters at each position along the tube section; and
F/L<10.

6. The multi-beam charged particle system of claim 5, wherein, for at least one of the first and second tubes, F/L<5.

7. The multi-beam charged particle system of claim 5, wherein, for at least one of the first and second tubes, F/L<2.

8. The multi-beam charged particle system of claim 7, wherein, for at least one of the first and second tubes, the tube comprises a contiguous wall that is free of perforations and has a cross section greater than one square millimeter.

9. The multi-beam charged particle system of claim 7, wherein, for each of the first and second tubes, the tube comprises a contiguous wall that is free of perforations and has a cross section greater than one square millimeter.

10. The multi-beam charged particle system of claim 6, wherein, for at least one of the first and second tubes, the tube comprises a contiguous wall that is free of perforations and has a cross section greater than one square millimeter.

11. The multi-beam charged particle system of claim 6, wherein, for each of the first and second tubes, the tube comprises a contiguous wall that is free of perforations and has a cross section greater than one square millimeter.

12. The multi-beam charged particle system of claim 5, wherein, for at least one of the first and second tubes, the tube comprises a contiguous wall that is free of perforations and has a cross section greater than one square millimeter.

13. The multi-beam charged particle system of claim 5, wherein, for each of the first and second tubes, the tube comprises a contiguous wall that is free of perforations and has a cross section greater than one square millimeter.

14. The multi-beam charged particle system of claim 5, further comprising a condenser lens, wherein the first tube extends through the condenser lens.

15. The multi-beam charged particle system of claim 14, further comprising an objective lens, wherein the second tube extends through at least a portion of the objective lens.

16. The multi-beam charged particle system of claim 5, further comprising an objective lens, wherein the second tube extends through at least a portion of the objective lens.

17. The multi-beam charged particle system of claim 5, wherein the multi-beam charged particle system is configured so that, during operation of the multi-beam charged particle system, a vacuum pressure within the second vacuum space can be below $1 \cdot 10^{-7}$ mbar.

18. The multi-beam charged particle system of claim 17, further comprising a condenser lens, wherein the first tube extends through the condenser lens.

19. The multi-beam charged particle system of claim 17, further comprising an objective lens, wherein the second tube extends through at least a portion of the objective lens.

20. A multi-beam charged particle system, comprising:
a vacuum enclosure comprising first, second and third vacuum spaces, the first vacuum space being in communication with the second vacuum space, and the second vacuum space being in communication with the third vacuum space;
a particle source arranged in the first vacuum space and configured to generate charged particles so that the charged particles enter the second vacuum space;
a multi-aperture plate module comprising a multi-aperture plate, the multi-aperture plate module being arranged in the second vacuum space so that: charged particles entering the second vacuum space traverse apertures of the multi-aperture plate; and form a plurality of particle beams downstream of the multi-aperture plate module which enter the third vacuum space; and
an object stage mounted in the third vacuum space so that the particle beams entering the third vacuum space are incident on an object mounted on the object stage,
wherein the multi-beam charged particle system is configured so that, during operation of the multi-beam charged particle system, a vacuum pressure within the second vacuum space can be below $1 \cdot 10^{-7}$ mbar.

* * * * *